June 10, 1969 W. S. FRANKLIN 3,449,640

SIMPLIFIED STACKED SEMICONDUCTOR DEVICE

Filed March 24, 1967 Sheet 1 of 3

INVENTOR.
WILLIAM S. FRANKLIN
BY Arthur L. Lessler
ATTORNEY

June 10, 1969 W. S. FRANKLIN 3,449,640

SIMPLIFIED STACKED SEMICONDUCTOR DEVICE

Filed March 24, 1967 Sheet 2 of 3

INVENTOR.

WILLIAM S. FRANKLIN

BY Arthur L. Lessler

ATTORNEY

June 10, 1969 W. S. FRANKLIN 3,449,640

SIMPLIFIED STACKED SEMICONDUCTOR DEVICE

Filed March 24, 1967 Sheet 3 of 3

INVENTOR.
WILLIAM S. FRANKLIN
BY
Arthur L. Lessler
ATTORNEY

United States Patent Office
3,449,640
Patented June 10, 1969

3,449,640

SIMPLIFIED STACKED SEMICONDUCTOR DEVICE

William S. Franklin, North Palm Beach, Fla., assignor to International Telephone and Telegraph Corporation, a corporation of Delaware Filed Mar. 24, 1967, Ser. No. 625,857
Int. Cl. H01l 5/00, 7/00
U.S. Cl. 317—234 8 Claims

ABSTRACT OF THE DISCLOSURE

A semiconductor device, e.g. a high frequency power transistor, made up of a number of interlocking component parts which may be readily assembled utilizing mass production techniques. After assembly, ("stacking" the parts), the stacked array is passed through a furnace to solder all connections simultaneously. The device includes (i) an upper terminal member, (ii) an active semiconductor element located in a recess in the upper member, (iii) a dielectric spacer having slots therein lined with conductive material, the slots being flared at one surface of the spacer to engage and index with corresponding raised terminals of the active element, and (iv) a lower terminal member joined to a metallized area on the opposite surface of the spacer (said metallized area being electrically connected to one of the conductive slot linings) together with (v) means for making electrical connections to another metallized area on said opposite surface (the other metallized area being electrically connected to the other conductive slot lining), the upper terminal member and the lower terminal member.

BACKGROUND OF THE INVENTION

This invention relates to semiconductor devices and assemblies thereof, and more particularly to a novel semiconductor structure susceptible of fabrication by relatively simple mass production techniques.

In the manufacture of semiconductor devices, one of the more serious problems associating with obtaining a reliable structure is the connection of the active regions of the semiconductor element to the external device terminals. These connections must exhibit relatively low electrical resistance between the electrodes of the active element and the external device terminals. Where high power, high frequency operation is to be realized, these connections must also be of low distributed reactance (it is especially important to keep the series inductance low) as well as providing a low thermal resistance between the semiconductor body and at least one of the device terminals for heat sink purposes.

Heretofore, the great majority of semiconductor devices have been manufactured in such a fashion that the active semiconductor element is located on and secured to a header or other suitable casing the casing supporting a number of relatively massive terminal leads. A number of thin connecting leads are then employed to join each electrode of the semiconductor element to a corresponding terminal lead. Thus, for each electrode two electrical bonds must be made. For a semiconductor device having three electrodes, such as a conventional bipolar junction transistor, a minimum of six bonds would be required. These bonds, especially those formed directly to the semiconductor body, are relatively weak mechanically and of low reliability compared to the other elements of the device structure.

In addtiion, in assembling semiconductor devices according to these prior art techniques, it is generally necessary to employ a microscope or high power magnifying glass together with sophisticated handling apparatus, whereby an operator positions the wire to be bonded adjacent the corresponding electrode of the semiconductor body and manually controls the formation of each such bond. This is a rather tedious and expensive manufacturing technique. Attempts have been made to provide a semiconductor structure susceptible of fabrication such that the external device terminals may be directly connected to the electrodes of the semiconductor body. Such a technique is exemplified, e.g., by that of U.S. Patent No. 3,202,888. However, these techniques involve rather elaborate handling techniques, and do not do away with the necessity for the use of microscopes or high power magnifying glasses, since it is still necessary to closely control the positioning of a number of the piece parts.

Accordingly, an object of the present invention is to provide an improved stacked semiconductor device structure wherein no intermediate connecting leads are required between the semiconductor electrodes and the external device terminals.

Another object of the invention is to provide such an improved structure wherein the various piece parts are adapted to engage and index with each other so that assembly of the device may be accomplished readily by mass production techniques.

Another object of the invention is to provide a stacked semiconductor device structure suitable for use with high power, high frequency active semiconductor elements.

SUMMARY

The aforementioned objects are realized by providing a novel semiconductor structure including (i) an upper terminal member having a recess adapted to engage and index with (ii) an active semiconductor element, one electrode of said element being bonded to said member directly at the surface of the recess, (iii) an insulating spacer having a plurality of slots therethrough between opposed surfaces of said spacer, each of said slots having an internal conductive lining and a flared end portion at one major surface of the spacer, each said flared end being adapted to engage and index with a corresponding ridge-like raised electrode of the semiconductor element, and (iv) a lower terminal member having a recess adapted to engage and index with an opposite surface of the spacer, the lower terminal member being bonded to a metallized area on said opposite spacer surface, said metallized area being electrically connected to the inner conductive lining of one of said slots, said opposite spacer surface also having an additional metallized area electrically connected to the conductive lining within the other of said slots, and (v) first, second and third means for making electrical connection to the upper terminal member, the other metallized area of said spacer, and the lower terminal member respectively.

IN THE DRAWING

FIG. 3B shows a side sectional view of said spacer taken along the cutting plane C–C' of FIG. 3A.

DETAILED DESCRIPTION

Figure 4:
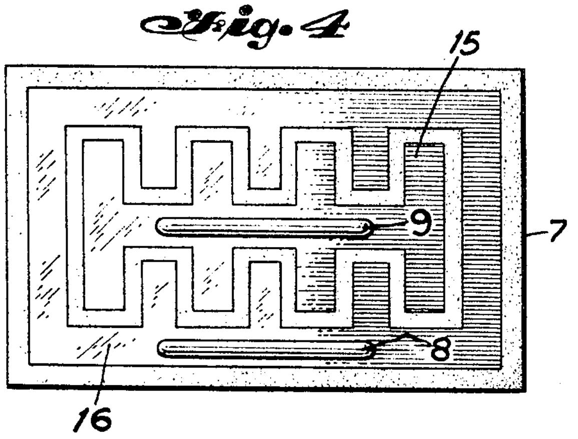
FIG. 4 shows a top plan view of the active semiconductor element employed in the specific embodiment shown in FIG. 1.

Referring to FIG. 4, the active element 7 employed in the preferred embodiment of my invention is a high power, high frequency transistor of interdigitated construction. The transistor 7 has a central emitter region and overlying emitter contact metallization 15 in the form of a central leg with a plurality of fingers extending therefrom. Disposed on and in electrical contact with the emitter leg is a raised ridge-like emitter electrode 9 comprising a solderable material such as gold. Alternatively, the raised electrode 9 may comprise a lead-tin or gold-germanium solder. The emitter contact metallization 15 is preferably a deposited layer of aluminum formed by well-known vacuum deposition and photoetching techniques. The raised elongated ridge-like emitter electrode 9 may be formed by thick plating or solder dipping techniques. We prefer to form the raised electrode 9 by solder dipping, i.e. by masking the entire surface of the semiconductor emitter 7 except the elongated portion upon which the electrode is to be formed, with a suitable protective layer such as deposited silicon dioxide, and subsequently immersing the semiconductor element 7 in a solder bath so that the solder adheres only to the exposed area of the aluminum contact metallization 15 along the emitter leg to form the desired raised solder contact 9.

Surrounding the emitter region is a base region and overlying contact metallization (preferably also of aluminum 16, in the form of a plurality of arms interdigitated with the fingers of the emitter structure. Disposed on the base contact metallization 16 is an elongated raised ridge-like solderable electrode 8 spaced from and substantially parallel to the emitter electrode 9. The raised base electrode 8 may be formed in similar fashion to the raised emitter electrode 9, and I prefer to form both raised electrodes at the same time by the aforementioned solder dipping technique.

A suitable solderable film 17 (FIG. 2) is deposited on the opposite surface of the semiconductor element 7 to form the collector electrode of said element. The resultant electrode structure of the active element 7 is shown in sectional view in FIG. 2.

Figure 1:
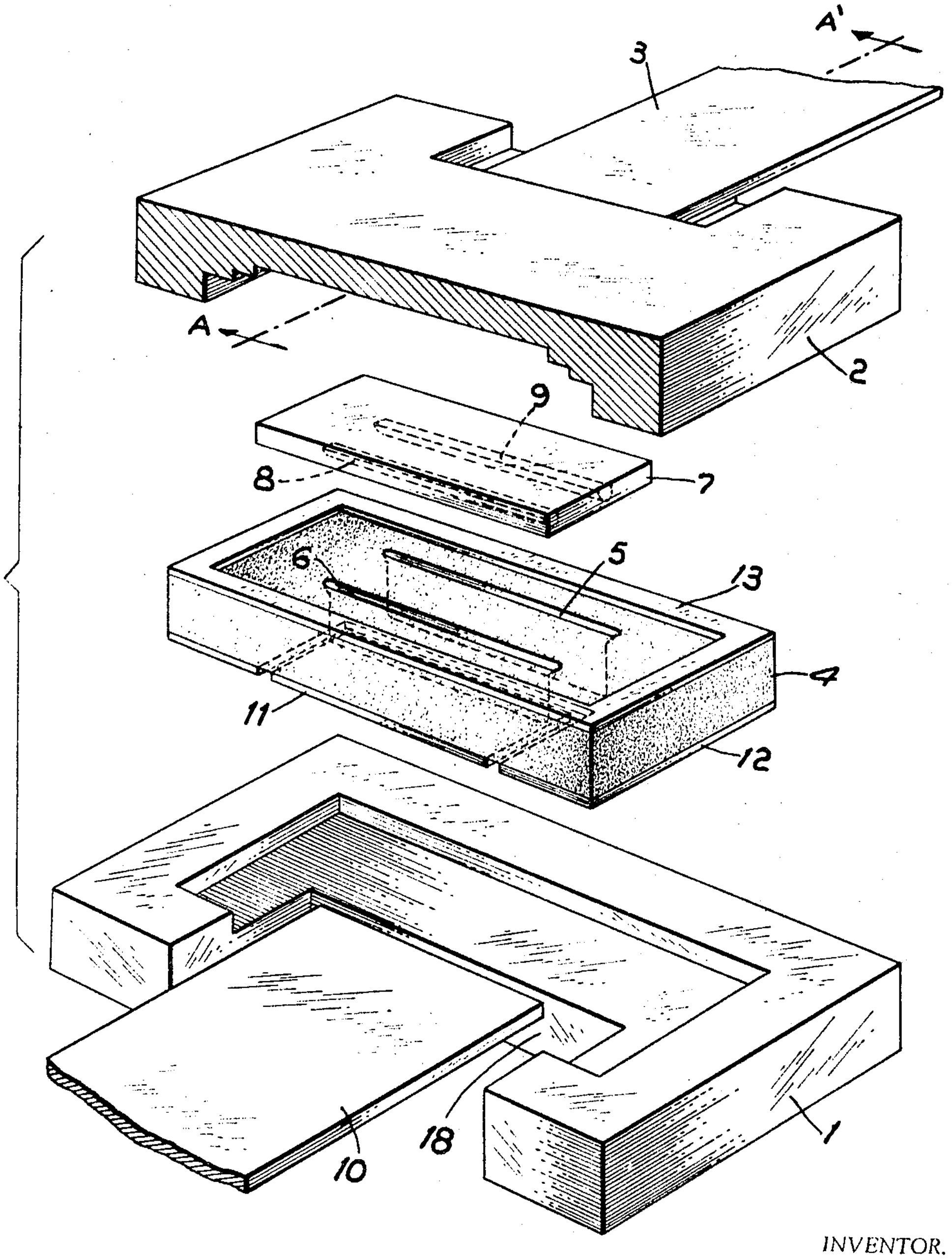
FIG. 1 shows an exploded view of a preferred embodiment of the invention.

Referring to FIG. 1, there are shown the various piece parts employed in fabricating the preferred embodiment of the stacked structure of my invention.

The various piece parts include:

(i) An upper terminal member 2 of conductive material. The upper terminal member 2 preferably comprises a metallic mass having a coefficient of thermal expansion comparable to that of the semiconductor element 7. In my preferred embodiment, the element 7 comprises silicon, and the upper terminal member 2 comprises molybdenum;

(ii) The active semiconductor element 7, which is shown oriented so that the metallic film 17 (FIG. 2) comprising the collector electrode is facing toward the upper terminal member 2. The semiconductor element 7 is shown as being rectangular, and the lower surface of the upper terminal member 2 contains a rectangular recess adapted to engage and index with the semiconductor element 7;

(iii) An insulating spacer 4. The spacer preferably has a coefficient of expansion similar to that of the semiconductor element 7 and the lower terminal member 1. I have found that a beryllium oxide spacer is suitable for this purpose. The spacer 4 has two slots 5 and 6 therethrough between exposed surfaces of said spacer. The slots 5 and 6 are adapted to align with the elongated raised emitter and base contacts 9 and 8 respectively of the semiconductor element 7. The slots 5 and 6 are each chamfered at the upper surface of the spacer 4 to form outwardly flared ends adapted to engage and index with the corresponding raised emitter and base electrodes 9 and 8. The slots and the outwardly flared ends are clearly evident in FIG. 3D, as well as FIG. 2. The upper surface of the spacer 4 also contains an auxiliary metallized strip 13. This auxiliary strip is solderable and is adapted to be bonded to a corresponding ledge of the upper terminal member 2 when the device is assembled. Each of the slots 5 and 6 has a conductive lining on the inner walls thereof extending between the opposite surfaces of the spacer 4, as shown, e.g., in FIGS. 2 and 3D. These conductive linings are formed by conventional metallizing techniques. The lower surface of the spacer 4 has first and second solderable metallized areas 12 and 11 respectively. The first metallized area 12 is electrically connected to the conductive lining on the inside wall of the slot 5, whereas the second metallized area 11 is electrically connected to the conductive lining on the inner wall of the slot 6. All metallization on the inner and outer surfaces of the spacer 4 is solderable. While the spacer 4 is shown in the assembly drawing of FIG. 1 as though it were transparent, this is done merely to facilitate an understanding of the invention. Such transparency is not in fact intended; the beryllium oxide spacer employed according to my preferred embodiment is opaque;

(iv) A lower terminal member 1 comprising a conductive mass having a coefficient of expansion similar to that of the spacer 4. In my preferred embodiment molybdenum is used for this purpose. The lower terminal member 1 has a rectangular recess in the upper surface thereof adapted to engage and index with the lower surface of the spacer 4. The recess in the lower terminal member is shaped in such a manner as to have a deepened portion 18 adjacent the second metallized area 11 of the spacer 4, in order to insure electrical isolation between the second metallized area 11 and the lower terminal member 1. In the preferred embodiment of FIG. 1 this deepened portion 18 extends entirely through the body of the lower terminal member 1;

(v) A collector tab 3 adapted to be soldered to the upper surface of the upper terminal member 2. While the collector tab 3 is shown positioned in a recess in the upper terminal member 2 such that the upper surface of the tab 3 and the member 2 are substantially coplanar, it would be equally satisfactory to have the tab 3 cover substantially the entire upper surface of the upper terminal member 2 without employing any recesses in conjunction therewith; and (vi) A base tab 10 adapted to be soldered to the metallized area 11 of the spacer 4. The tab 10 extends into the deepened portion 18 of the shaped recess in the lower terminal member 1.

Figure 2:
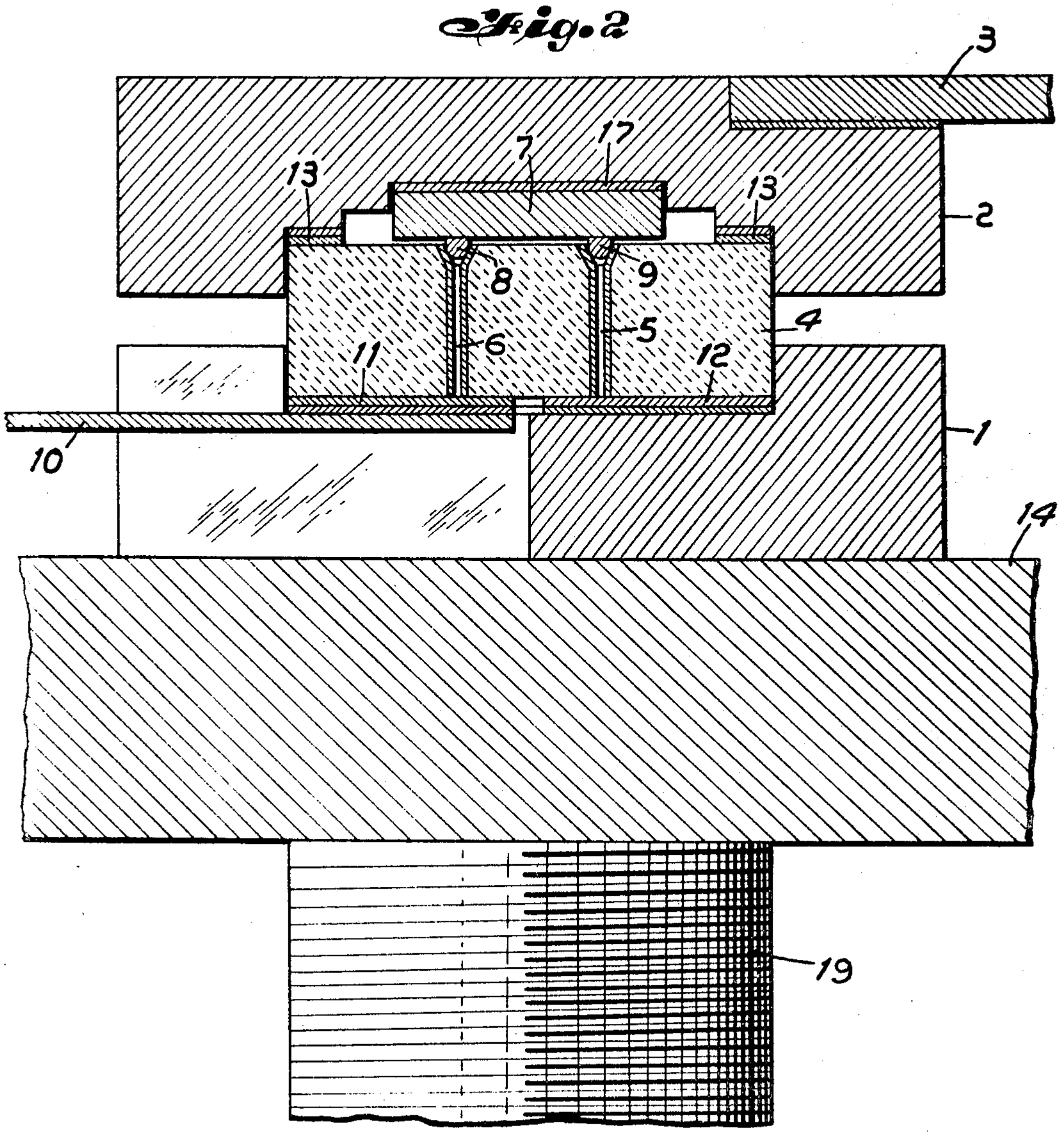
FIG. 2 shows a cross sectional view of the assembled device of FIG. 1 taken along the cutting plane A–A'.
Figure 3A:
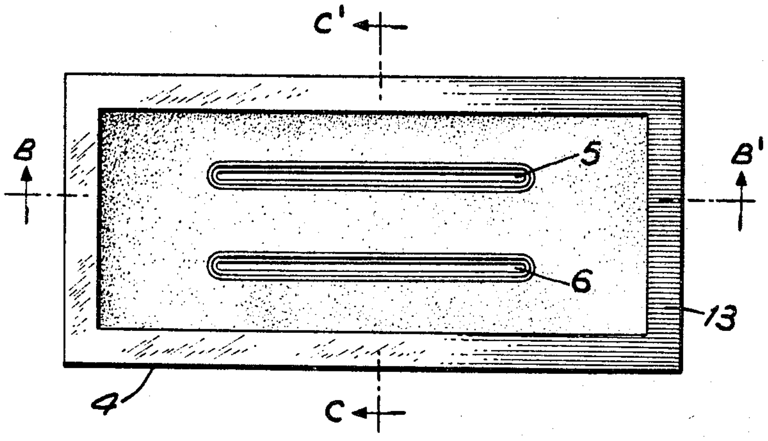
FIG. 3A shows a top plan view of the spacer employed in the device of FIG. 1.
Figure 3C:
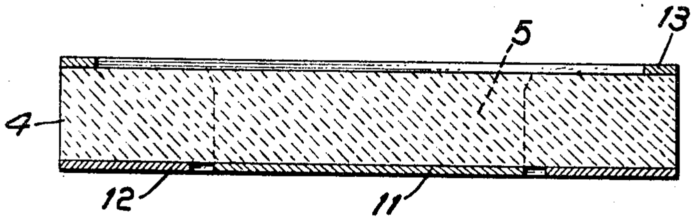
FIG. 3C shows a front sectional view of said spacer taken along the cutting plane B–B' of FIG. 3A.
Figure 3D:
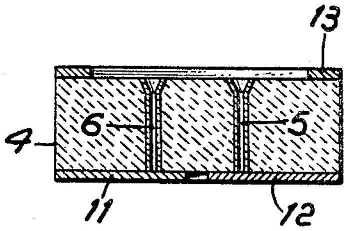
FIG. 3B shows a bottom plan view of said spacer.
Figure 3B:
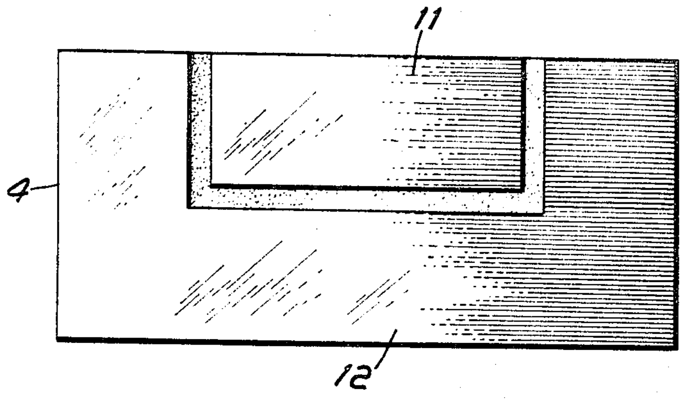

In fabricating the stacked structure shown in FIG. 1, the various piece parts are assembled simply by stacking one part upon the other, commencing either with the lower terminal member 1 and base tab 10 (the base tab 10 being supported by a suitable shim placed in the deepened portion 18) or with the upper terminal member 2 and the collector tab 3. I prefer to fabricate the lower terminal member 1 as an integral part of a conventional transistor header 14 having a threaded stud 19 extending therefrom, as shown in FIG. 2. When this is done, the lower terminal member 1 may be readily milled from the upper surface of the header 14, thus providing a connection of good electrical and thermal conductivity between the lower terminal header 1 and the header 14. When this construction is employed, a suitable shim is placed in the deepened portion 18 and the base tab 10 is supported thereon, so that the upper surface of the tab 10 is substantially coplanar with the bottom of the relatively shallow portion of said shaped recess. The beryllium oxide spacer 4 is then placed on the lower terminal member 1 and indexed with the recess thereof, so that the metallized area 12 is contiguous with the relatively shallow portion of the recess and the metallized area 11 is contiguous with the end of the base tab 10. The metallized areas may be solder coated, or alternatively solder preforms may be employed between the adjacent piece parts.

Next, the active semiconductor element 7, i.e. the power transistor of FIG. 4, is placed on the spacer 4 so that the raised electrodes 9 and 8 engage an index with the flared ends of the slots 5 and 6 respectively. Then the upper terminal member 2 is placed on the stacked assembly of the semiconductor element 7 and the spacer 4 so that the semiconductor element 7 engages and indexes with a rectangular recess in the upper terminal member 2, while the auxiliary strip 13 (which is coated with solder) engages and indexes with a corresponding ledge of the upper terminal member 2. The collector electrode 17 (FIG. 2) may be coated with solder (by dipping or any other suitable method) or alternatively a solder preform may be employed between the electrode 17 and the surface of the mating recess in the upper terminal member 2. Next, the collector tab 3 is placed in a mating recess in the upper surface of the upper terminal member 2, and a suitable weight (not shown) is placed upon the upper surface of the upper terminal member 2 to hold the piece parts of the stacked structure in indexed relationship, and to press the various piece parts together. It should be clear that the various solder connections may be formed by the use of solder coated surfaces or solder preforms, and parts availability and coat will determine which technique is used for each particular connection.

After the piece parts have been stacked and the weight applied to the stack, the entire stacked array is passed through a furnace to melt the various solder coatings or preforms and to solder all connections simultaneously. The resultant completed structure is shown in sectional view in FIG. 2. It will be noted that the thickness of the insulating spacer 4 relative to the dimensions of the recess in the upper and lower terminal members 2 and 1 respectively is chosen such that these members remain electrically isolated from each other. That is, the thickness of the insulating spacer 4 between the oppositely disposed surfaces thereof is substantially greater than the sum of the depths of the mating recesses in the upper and lower terminal members.

In the assembled structure of FIG. 2, it will be noted that the active element 7 has been connected to the external device electrodes 3, 10 and 15 to form a grounded emitter structure. That is, the emitter electrode 9 is electrically connected to the header 14 and threaded stud 19, the collector electrode 17 is electrically connected to the collector tab 3, and the base electrode 8 is electrically connected to the base tab 10.

While the principles of the invention have been described above in connection with specific embodiments, and particular modifications thereof, it is to be clearly understood that this description is made only by way of example and not as a limitation of the scope of the invention.

I claim:

1. A semiconductor device, comprising:

an active semiconductor element comprising a wafer of semiconductor material having first, second and third electrodes, said first electrode comprising a solderable metallic film disposed on one major surface of said wafer and covering a substantial portion of said surface, each of said second and third electrodes comprising an elongated solderable metallic ridge disposed on the opposite major surface of said wafer and extending above the adjacent portion of said opposite surface;

an upper terminal member comprising a conductive body having a recess adapted to engage and index with said element, the first electrode of said element being soldered to at least a portion of the surface of said recess to form a joint therewith having good electrical and thermal conductivity;

a spacer of electrically insulating material having good thermal conductivity between upper and lower oppositely disposed surfaces of said spacer, said spacer having first and second slots therein each extending between said upper and lower surfaces, the inner walls of each of said slots having an electrically conductive film disposed thereon, the portions of said first and second slots extending to said upper surface being chamfered to form flared ends adapted to engage and index with said second and third electrodes respectively, the flared ends of said first and second slots being soldered to respective ones of said second and third electrodes, the lower surface of said spacer having first and second solderable metallized areas electrically connected to the metallic films of said first and second slots respectively whereby each of said first and second areas is electrically coupled to a respective one of said second and third electrodes, the upper surface of said spacer having an auxiliary solderable metallized strip disposed thereon, said strip being soldered to said upper terminal member to mechanically bond said spacer to said member;

a lower terminal member comprising a conductive body having a shaped recess adapted to engage and index with said spacer, the third metallized area of said spacer being soldered to at least a portion of the surface of said shaped recess to form a joint therewith having good electrical and thermal conductivity, said shaped recess having a deepened portion adjacen said second metallized area of said spacer such that no part of said second area is contiguous with said lower terminal member; and first, second and third means for making electrical connection to said upper terminal member, said second metallized area and said lower terminal member respectively.

2. A semiconductor device according to claim 1, wherein the thickness of said spacer between said oppositely disposed surfaces thereof is substantially greater than the sum of the depths of said recesses, such that said spacer serves to electrically isolate the body of said upper terminal member from the body of said lower terminal member.

3. A semiconductor device according to claim 2, wherein said second connection means comprises a second electrically conductive tab soldered to said second metallized area and extending into the deepened portion of said recess.

4. A semiconductor according to claim 3, wherein said first connection means comprises a first electrically conductive tab soldered to the body of said upper terminal member.

5. A semiconductor device according to claim 1, wherein said active element is a junction transistor, said first, second and third electrodes being the collector, base and emitter electrodes of said transistor respectively.

6. A semiconductor device according to claim 2, further comprising heat sink means including a header of good thermal conductivity secured to a selected one of said terminal members, said header being relatively massive in comparison to said active element.

7. A semiconductor device according to claim 6, wherein said selected terminal member comprising an integrally formed part of said header.

8. A semiconductor device according to claim 7, wherein said selected member in said lower terminal member.

References Cited

UNITED STATES PATENTS

| | | | |
|---|---|---|---|
| 2,634,322 | 4/1953 | Law | 317—234 |
| 2,804,581 | 8/1957 | Lichtgarn | 317—234 |
| 3,200,468 | 8/1965 | Dahlberg | 317—234 |
| 3,202,888 | 8/1965 | Evander et al. | 317—234 |

JOHN W. HUCKERT, *Primary Examiner.*

A. J. JAMES, *Assistant Examiner.*

U.S. Cl. X.R.

29—471.9, 472.9; 317—235